United States Patent
Chi et al.

(10) Patent No.: US 8,710,634 B2
(45) Date of Patent: Apr. 29, 2014

(54) INTEGRATED CIRCUIT PACKAGING SYSTEM WITH AN INTEGRAL-INTERPOSER-STRUCTURE AND METHOD OF MANUFACTURE THEREOF

(75) Inventors: HeeJo Chi, Daejeon-si (KR); Jae Han Chung, Ichon-si (KR); Junwoo Myung, Ichon-si (KR); YeongIm Park, Suwon (KR); HyungMin Lee, Bucheon-si (KR)

(73) Assignee: Stats Chippac Ltd., Singapore (SG)

( * ) Notice: Subject to any disclaimer, the term of this patent is extended or adjusted under 35 U.S.C. 154(b) by 406 days.

(21) Appl. No.: 12/410,945

(22) Filed: Mar. 25, 2009

(65) Prior Publication Data

US 2010/0244222 A1 Sep. 30, 2010

(51) Int. Cl.
  *H01L 23/552* (2006.01)
  *H01L 23/28* (2006.01)
  *H01L 21/44* (2006.01)

(52) U.S. Cl.
  USPC ........... 257/659; 257/687; 257/787; 438/107; 438/127

(58) Field of Classification Search
  USPC ................ 257/659, 660, 687, 691, 692, 787, 257/E21.499, E23.114; 438/107–109, 438/126–127
  See application file for complete search history.

(56) References Cited

U.S. PATENT DOCUMENTS

| | | | |
|---|---|---|---|
| 6,713,878 B2 | 3/2004 | Goetschalckx | |
| 6,933,598 B2 | 8/2005 | Karnezos | |
| 7,132,311 B2 | 11/2006 | Akiba et al. | |
| 7,261,596 B2 | 8/2007 | Akaike et al. | |
| 7,479,407 B2 | 1/2009 | Gehman et al. | |
| 7,514,774 B2 | 4/2009 | Leung et al. | |
| 7,537,962 B2 | 5/2009 | Jang et al. | |
| 7,618,846 B1 * | 11/2009 | Pagaila et al. | 438/113 |
| 7,633,765 B1 | 12/2009 | Scanlan et al. | |
| 2006/0244117 A1 | 11/2006 | Karnezos et al. | |
| 2006/0244157 A1 | 11/2006 | Carson | |
| 2007/0108582 A1 | 5/2007 | Karnezos | |
| 2007/0246806 A1 | 10/2007 | Ong et al. | |
| 2007/0246813 A1 | 10/2007 | Ong et al. | |
| 2008/0150093 A1 | 6/2008 | Jang et al. | |
| 2008/0157344 A1 | 7/2008 | Chen et al. | |
| 2009/0001612 A1 * | 1/2009 | Song et al. | 257/787 |
| 2009/0146315 A1 | 6/2009 | Shim et al. | |
| 2010/0065948 A1 | 3/2010 | Bae et al. | |

* cited by examiner

*Primary Examiner* — Hung Vu
(74) *Attorney, Agent, or Firm* — Ishimaru & Associates LLP (57) ABSTRACT

A method of manufacture of an integrated circuit packaging system includes: providing a substrate having a substrate-interconnect; mounting an integrated circuit above and to the substrate; mounting an internal interconnect to the substrate-interconnect; mounting a structure having an integral-interposer-structure over the substrate and over the integrated circuit with the integral-interposer-structure connected to the internal interconnect; and encapsulating the internal interconnect and the integrated circuit with an encapsulation.

12 Claims, 11 Drawing Sheets

INTEGRATED CIRCUIT PACKAGING SYSTEM WITH AN INTEGRAL-INTERPOSER-STRUCTURE AND METHOD OF MANUFACTURE THEREOF

TECHNICAL FIELD

The present invention relates generally to an integrated circuit packaging system and more particularly to a system for utilizing an integral-interposer-structure in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate having a substrate-interconnect; mounting an integrated circuit above and to the substrate; mounting an internal interconnect to the substrate-interconnect; mounting a structure having an integral-interposer-structure over the substrate and over the integrated circuit with the integral-interposer-structure connected to the internal interconnect; and encapsulating the internal interconnect and the integrated circuit with an encapsulation.

The present invention provides an integrated circuit packaging system including: a substrate having a substrate-interconnect; an internal interconnect mounted to the substrate-interconnect; a structure having an integral-interposer-structure mounted over the substrate with the integral-interposer-structure connected to the internal interconnect; an integrated circuit mounted to the substrate and under the integral-interposer-structure; and an encapsulation encapsulating the internal interconnect and the integrated circuit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
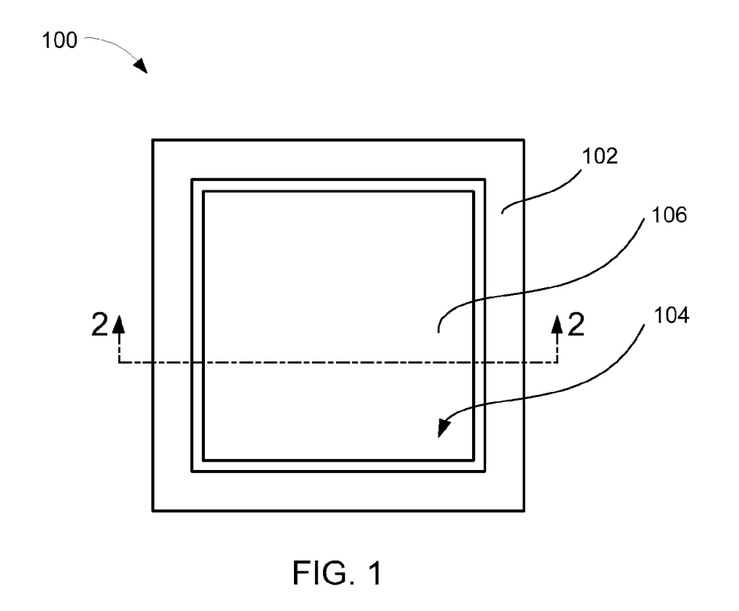
FIG. 1 is a top view of an integrated circuit packaging system in an embodiment of the present invention.

Referring now to FIG. 1, therein is shown a top view of an integrated circuit packaging system 100 in an embodiment of the present invention. The integrated circuit packaging system 100 is shown having an encapsulation 102 surrounding an exposed portion 104 of a structure such as an interposer 106.

Figure 2:
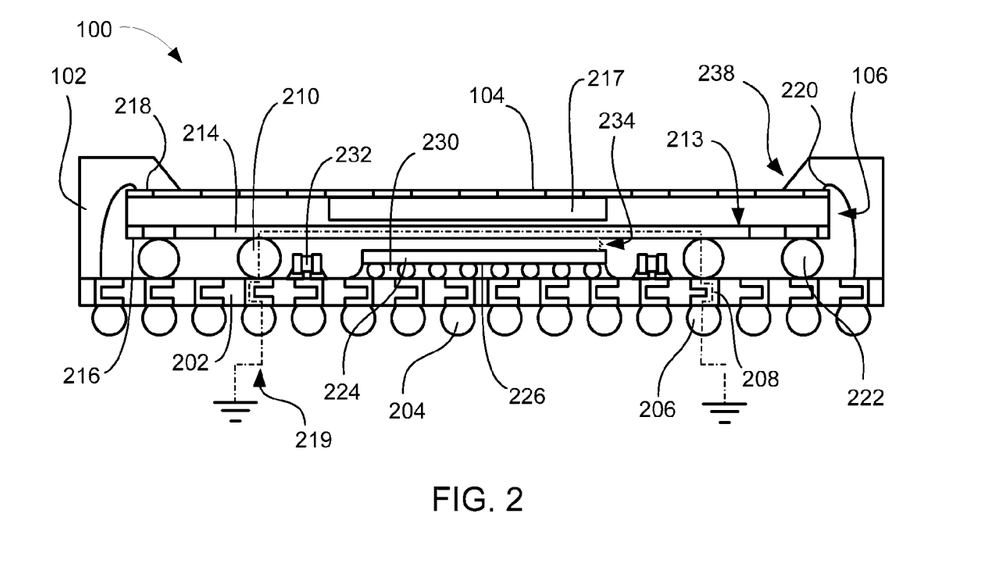
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

Below the substrate 202 are first external interconnects such as solder bumps 204. Below the substrate 202 second external interconnects 206 such as solder bumps are also mounted. The second external interconnects 206 are connected to the substrate 202 and to substrate-interconnects 208 within the substrate.

The substrate-interconnects 208 electrically connect the second external interconnects 206 through the substrate 202 to first internal interconnects 210, such as solder pillars, mounted above the substrate 202.

Mounted above the first internal interconnects 210 is the interposer 106. The interposer 106 is typically a UV stabilized woven glass and epoxy resin with etched copper conductive pathways and acts as an interfacing structure when other electronic components are mounted externally.

The interposer 106 has an integral-interposer-structure 213, such as an integral-conductive-shield 214, for instance a copper sheet, attached along a bottom surface 216 of the interposer 106. Similarly the interposer 106 has an embedded die 217 embedded in the interposer 106 between a top surface 218 and the bottom surface 216 of the interposer 106. The embedded die 217 may be connected either to the top surface 218 of the interposer 106, the bottom surface 216 of the interposer 106, or both.

The integral-conductive-shield 214 is integral to the interposer 106 because the integral-conductive-shield 214 is formed along with the bottom surface 216 of the interposer 106. The integral-conductive-shield 214 is attached and electrically connected to the first internal interconnects 210. This provides a grounding path 219 from the integral-conductive-shield 214 through the first internal interconnects 210, the substrate-interconnects 208, and the second external interconnects 206.

The grounding path 219 may be connected to ground when incorporated into a larger electronic system. It has been discovered that the integral-conductive-shield 214 provides a very large grounding plane at an intermediate level. This enhances electrical performance of external components mounted to the interposer 106.

It has further been discovered that the grounding path 219 through the first internal interconnects 210 provides a reduced path to ground improving the integral-conductive-shield 214 performance.

The interposer 106 is connected to the substrate 202 from above with second internal interconnects such as bond wires 220 and from below with third internal interconnects such as solder balls 222 which flank the first internal interconnects 210.

Mounted above the substrate 202 and between the first internal interconnects 210 is an integrated circuit 224 such as a flip-chip with an active side 226. The integrated circuit 224 is mounted on the substrate 202 with the integral-interposer-structure 213 over the integrated circuit 224. The integral-interposer-structure 213 overlaps the integrated circuit 224 and extends past peripheral sides of the integrated circuit 224. The grounding path 219 extends over and across the integrated circuit 224. The active side 226 of the integrated circuit 224 faces toward the substrate 202 and is connected to the substrate with the solder balls 222.

An underfill 230 fills between the integrated circuit 224 and the substrate 202. The underfill 230 provides extra rigidity and thermal conductivity. Further, mounted above the substrate 202 and between the first internal interconnects 210 are passive components 232 such as resistors, capacitors, or inductors.

The first internal interconnects 210 provides a stand-off-height 234 between the integral-conductive-shield 214 and the integrated circuit 224 by supporting the integral-conductive-shield 214 above the integrated circuit 224.

Encapsulating the integrated circuit 224 and the passive components 232 is the encapsulation 102. The encapsulation 102 has encapsulation risers 238, which rise up from the interposer 106 and encapsulate the bond wires 220 connecting the interposer 106 to the substrate 202. Between the encapsulation risers 238 the exposed portion 104 of the interposer 106 may be connected to external electronic components, not shown.

Figure 3A:
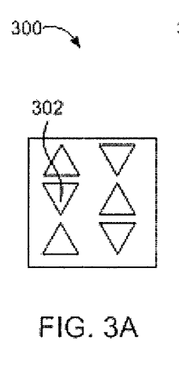
FIGS. 3A-D are bottom views of integral-conductive-shield for an embodiment of the present invention.

Referring now to FIG. 3A, therein is shown a bottom view of an integral-interposer-structure such as an integral-conductive-shield 300 for an embodiment of the present invention. The integral-conductive-shield 300 is shown with triangular-holes 302. The triangular-holes 302 may be made by etching the integral-conductive-shield 300. The triangular-holes 302 enhance durability by reducing delamination.

Figure 3B:
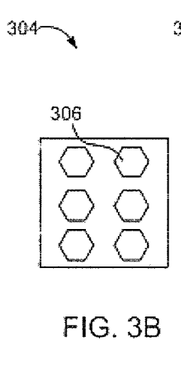

Referring now to FIG. 3B, therein is shown a bottom view of an integral-interposer-structure such as an integral-conductive-shield 304 for an embodiment of the present invention. The integral-conductive-shield 304 is shown with hexagonal-holes 306. The hexagonal-holes 306 may be made by etching the integral-conductive-shield 304. The hexagonal-holes 306 enhance durability by reducing delamination.

Figure 3C:
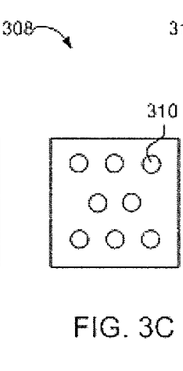

Referring now to FIG. 3C, therein is shown a bottom view of an integral-interposer-structure such as an integral-conductive-shield 308 for an embodiment of the present invention. The integral-conductive-shield 308 is shown with circular-holes 310. The circular-holes 310 may be made by etching the integral-conductive-shield 308. The circular-holes 310 enhance durability by reducing delamination.

Figure 3D:
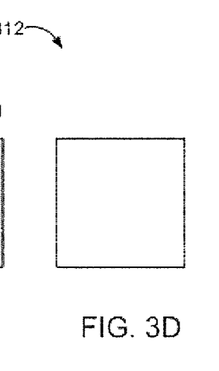

Referring now to FIG. 3D, therein is shown a bottom view of an integral-interposer-structure such as an integral-conductive-shield 312 for an embodiment of the present invention. The integral-conductive-shield 312 is shown as a solid shield. The solid shield has a higher effective shielding capacity.

Figure 4:
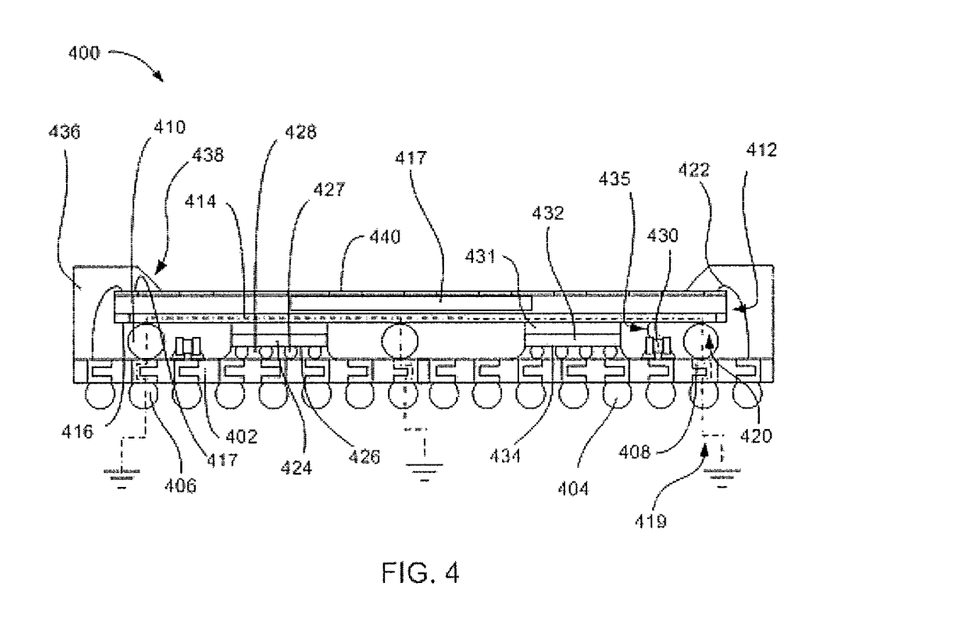
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate.

Below the substrate 402 are first external interconnects such as solder bumps 404. Below the substrate 402 second external interconnects 406 such as solder bumps are also mounted. The second external interconnects 406 are connected to the substrate 402 and to substrate-interconnects 408 within the substrate.

The substrate-interconnects 408 electrically connect the second external interconnects 406 through the substrate 402 to first internal interconnects 410, such as solder balls, mounted above the substrate 402.

Mounted above the first internal interconnects 410 is a structure such as an interposer 412. The interposer 412 is typically a UV stabilized woven glass and epoxy resin with etched copper conductive pathways and acts as an interfacing structure when other electronic components are mounted externally.

The interposer 412 has an integral-interposer-structure such as an integral-conductive-shield 414 such as a copper sheet attached to a bottom surface 416 of the interposer 412. The integral-conductive-shield 414 is attached to the first internal interconnects 410. This provides a grounding path 419 from the integral-conductive-shield 414 through the first internal interconnects 410, the substrate-interconnects 408, and the second external interconnects 406.

The interposer 412 has an integral-interposer-structure such as an integral-conductive-shield 414 such as a copper sheet attached to a bottom surface 416 of the interposer 412. Similarly the interposer 412 has an embedded die 417 embedded in the interposer 412 between a top surface 418 and the bottom surface 416 of the interposer 412. The embedded die 417 may be connected either to the top surface 418 of the interposer 412, the bottom surface 416 of the interposer 412, or both.

The grounding path 419 may be connected to ground when incorporated into a larger electronic system. It has been discovered that incorporating the integral-conductive-shield 414 into the bottom surface 416 of the interposer 412 substantially reduces costs. First, the process does not require additional shield forming or mounting processes, which decreases the amount of labor required to produce each unit.

Second, the integral-conductive-shield 414 does not require additional material to create an electromagnetic shield because the integral-conductive-shield 414 may be constructed in the interposer 412 using copper layers already used in the formation of the interposer 412. This may be achieved by leaving intact a metal layer forming the integral-conductive-shield 414 instead of selectively etching contact pads.

It has even further been discovered that the first internal interconnects 410 provide additional support under overhangs 420 of the interposer 412 during a wire-bonding phase of manufacture when the interposer 412 is connected to the substrate 402 with second internal interconnects such as bond wires 422.

Mounted above the substrate 402 and between the first internal interconnects 410 is a first integrated circuit 424 such as a flip-chip with an active side 426. The active side 426 of the first integrated circuit 424 faces toward the substrate 402 and is connected to the substrate with third internal interconnects such as solder balls 427. Filling between the first integrated circuit 424 and the substrate 402 is an underfill 428. The underfill 428 provides structural rigidity and thermal conductivity. Further mounted above the substrate 402 and between the first internal interconnects 410 are passive components 430 such as resistors, capacitors, or inductors.

Mounted beside the first integrated circuit 424 and between the first internal interconnects 410 is a second integrated circuit 432 such as a flip-chip with an active side 434. The active side 434 of the second integrated circuit 432 faces toward the substrate 402 and is connected to the substrate 402 with the solder balls 427. Filling between the second integrated circuit 432 and the substrate 402 is the underfill 428.

The first internal interconnects 410 provides a stand-off-height 435 between the integral-conductive-shield 414 and the passive components 430 by supporting the integral-conductive-shield 414 above the passive components 430.

Optionally, the interposer 412 may be attached to the first integrated circuit 424 and to the second integrated circuit 432 with a die attach adhesive 431. Encapsulating the first integrated circuit 424, the second integrated circuit 432, and the bond wires 422 is an encapsulation 436.

The encapsulation 436 has encapsulation risers 438, which rise up from the interposer 412 and encapsulate the bond wires 422. Between the encapsulation risers 438 an exposed portion 440 of the interposer 412 may be connected to external electronic components, not shown.

Figure 5:
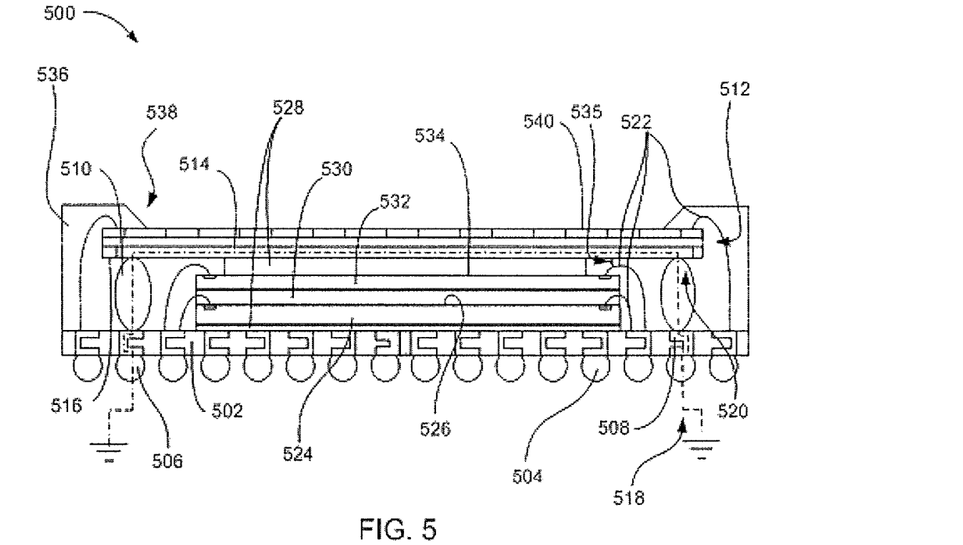
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a laminated plastic or ceramic substrate.

Below the substrate 502 are first external interconnects such as solder bumps 504. Below the substrate 502 second external interconnects 506 such as solder bumps are also mounted. The second external interconnects 506 are connected to the substrate 502 and to substrate-interconnects 508 within the substrate.

The substrate-interconnects 508 electrically connect the second external interconnects 506 through the substrate 502 to first internal interconnects 510, such as solder pillars, mounted above the substrate 502.

Mounted above the first internal interconnects 510 is a structure such as an interposer 512. The interposer 512 is typically a UV stabilized woven glass and epoxy resin with etched copper conductive pathways and acts as an interfacing structure when other electronic components are mounted externally.

The interposer 512 has an integral-interposer-structure such as an integral-conductive-shield 514 such as a copper sheet attached to a bottom surface 516 of the interposer 512. The integral-conductive-shield 514 is attached to the first internal interconnects 510. This provides a grounding path 518 from the integral-conductive-shield 514 through the first internal interconnects 510, the substrate-interconnects 508, and the second external interconnects 506. The grounding path 518 may be connected to ground when incorporated into a larger electronic system.

It has been discovered that the first internal interconnects 510 provide additional support under overhangs 520 of the interposer 512 during a wire-bonding phase of manufacture when the interposer 512 is connected to the substrate 502 with second internal interconnects such as bond wires 522.

Mounted above the substrate 502 and between the first internal interconnects 510 is a first integrated circuit 524 such as a wire-bonded die with an active side 526. The active side 526 of the first integrated circuit 524 faces away from the substrate 502 and is connected to the substrate with the bond wires 522. The first integrated circuit 524 is attached to the substrate 502 with a die attach adhesive 528.

Applied to the active side 526 of the first integrated circuit 524 is a wire-in-film adhesive 530. The wire-in-film adhesive 530 has a low viscosity and, as temperature increases, the viscosity gets lower. Therefore, the wire-in-film adhesive 530 can be easily pressed over the bond wires 522, above, and around the first integrated circuit 524 and then cured to harden the wire-in-film adhesive 530.

It has been discovered that the wire-in-film adhesive 530 should be a thermally conductive dielectric material. The wire-in-film adhesive 530 can be made of a B-stage material that can be hardened after curing and can maintain a predetermined thickness.

Mounted above the first integrated circuit 524 is a second integrated circuit 532 such as a wire-bonded die with an active side 534. The active side 534 of the second integrated circuit 532 faces away from the substrate 502 and is connected to the substrate 502 with the bond wires 522.

The first internal interconnects 510 provides a stand-off-height 535 between the integral-conductive-shield 514 and the bond wires 522 connecting the active side 534 of the second integrated circuit 532 to the substrate 502 by supporting the integral-conductive-shield 514 above the bond wires 522.

The interposer 512 is connected to the active side 534 of the second integrated circuit 532 with the die attach adhesive 528. Encapsulating the first integrated circuit 524, the second integrated circuit 532, and the bond wires 522 is an encapsulation 536.

The encapsulation 536 has encapsulation risers 538, which rise up from the interposer 512 and encapsulate the bond wires 522 connecting the interposer 512 to the substrate 502. Between the encapsulation risers 538 an exposed portion 540 of the interposer 512 may be connected to external electronic components, not shown.

Figure 6:
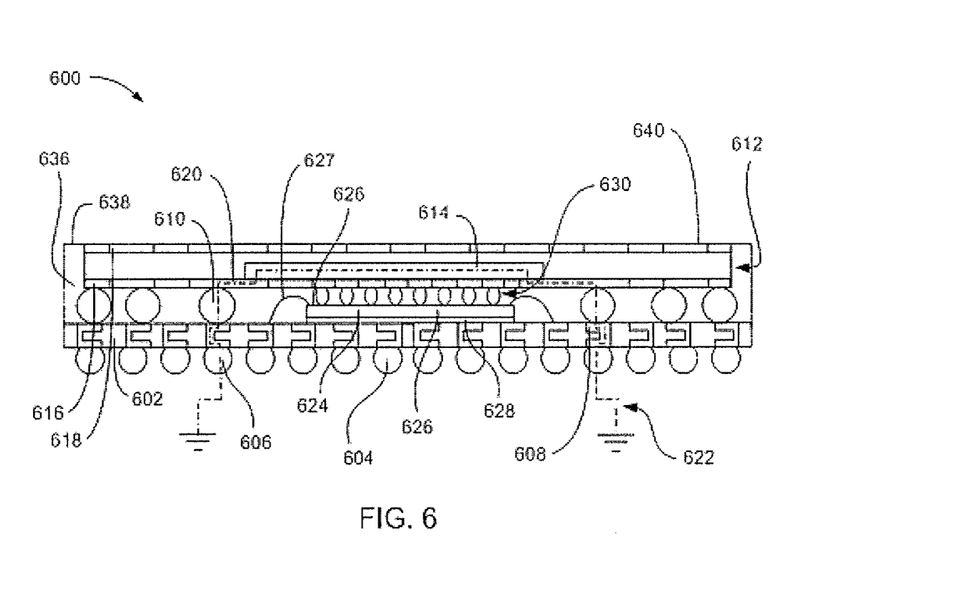
FIG. 6 is a cross-sectional view of an integrated circuit packaging system in a further embodiment of the present invention.

Referring now to FIG. 6, therein is shown a cross-sectional view of an integrated circuit packaging system 600 in a further embodiment of the present invention. The integrated circuit packaging system 600 is shown having a substrate 602 such as a laminated plastic or ceramic substrate.

Below the substrate 602 are first external interconnects such as solder bumps 604. Below the substrate 602 second external interconnects 606 such as solder bumps are also mounted. The second external interconnects 606 are connected to the substrate 602 and to substrate-interconnects 608 within the substrate.

The substrate-interconnects 608 electrically connect the second external interconnects 606 through the substrate 602 to first internal interconnects 610, such as solder balls, mounted above the substrate 602.

Mounted above the first internal interconnects 610 is a structure such as an interposer 612. The interposer 612 is typically a UV stabilized woven glass and epoxy resin with etched copper conductive pathways and acts as an interfacing structure when other electronic components are mounted externally.

The interposer 612 has an integral-interposer-structure such as an embedded die 614 mounted between a bottom portion 616 and a top portion 618 of the interposer 612. The embedded die 614 is attached to the bottom portion of the interposer 612 and connected to interposer-connection-pads 620. The interposer-connection-pads are connected to the first internal interconnects 610. This provides a connection path 622 from the embedded die 614 through the first internal interconnects 610, the substrate-interconnects 608, and the second external interconnects 606.

The connection path 622 may provide high density low distance connections when incorporated into larger electronic systems. It has been discovered that the incorporation of the embedded die 614 into the interposer 612 provides a reduced package height.

Mounted above the substrate 602 and between the first internal interconnects 610 is an integrated circuit 624 such as a flip-chip with an active side 626. The active side 626 of the integrated circuit 624 faces away from the substrate 602 and is connected to the substrate with second internal interconnects such as bond wires 627.

The integrated circuit 624 is attached to the substrate 602 with a die-attach-adhesive 628. The active side 626 of the integrated circuit 624 is further connected to the interposer 612 with third internal interconnects such as solder balls 630. The interposer 612 is further connected to the substrate 602 with the solder balls 630.

Encapsulating the integrated circuit 624 and the passive components 630 is an encapsulation 636. The encapsulation 636 has a top surface 638, which is level with an exposed portion 640 of the interposer 612. The exposed portion 640 may be connected to external electronic components, not shown.

Figure 7:
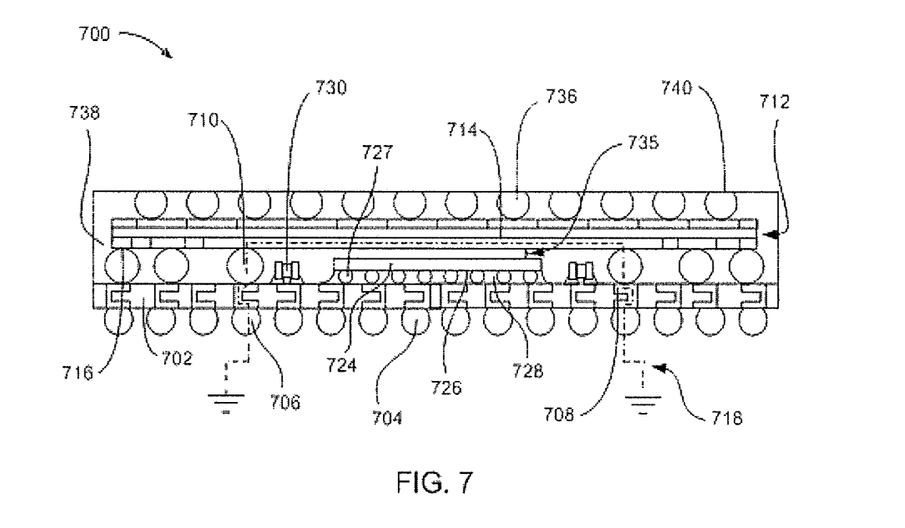
FIG. 7 is a cross-sectional view of an integrated circuit packaging system in a further embodiment of the present invention.

Referring now to FIG. 7, therein is shown a cross-sectional view of an integrated circuit packaging system 700 in a further embodiment of the present invention. The integrated circuit packaging system 700 is shown having a substrate 702 such as a laminated plastic or ceramic substrate.

Below the substrate 702 are first external interconnects such as solder bumps 704. Below the substrate 702 second external interconnects 706 such as solder bumps are also mounted. The second external interconnects 706 are connected to the substrate 702 and to substrate-interconnects 708 within the substrate.

The substrate-interconnects 708 electrically connect the second external interconnects 706 through the substrate 702 to first internal interconnects 710, such as solder balls, mounted above the substrate 702.

Mounted above the first internal interconnects 710 is a structure such as an interposer 712. The interposer 712 is typically a UV stabilized woven glass and epoxy resin with etched copper conductive pathways and acts as an interfacing structure when other electronic components are mounted externally.

The interposer 712 has an integral-interposer-structure such as an integral-conductive-shield 714 such as a copper sheet attached to a bottom surface 716 of the interposer 712. The integral-conductive-shield 714 is attached to the first internal interconnects 710. This provides a grounding path 718 from the integral-conductive-shield 714 through the first internal interconnects 710, the substrate-interconnects 708, and the second external interconnects 706. The grounding path 718 may be connected to ground when incorporated into a larger electronic system.

Mounted above the substrate 702 and between the first internal interconnects 710 is an integrated circuit 724 such as a flip-chip with an active side 726. The active side 726 of the integrated circuit 724 faces toward the substrate 702 and is connected to the substrate with third internal interconnects such as solder balls 727.

An underfill 728 fills between the integrated circuit 724 and the substrate 702. The underfill 728 provides extra rigidity and thermal conductivity. Further, mounted above the substrate 702 and between the first internal interconnects 710 are passive components 730 such as resistors, capacitors, or inductors.

The first internal interconnects 710 provides a stand-off-height 735 between the integral-conductive-shield 714 and the integrated circuit 724 by supporting the integral-conductive-shield 714 above the integrated circuit 724. The interposer 712 is further connected to the substrate 702 with the solder balls 727.

Mounted above the interposer 712 are embedded solder balls 736. An encapsulation 738 partially encapsulates the embedded solder balls 736 leaving exposed portions 740 of the embedded solder balls 736 that may be connected to external electronic components, not shown. The encapsulation 738 also encapsulates the integrated circuit 724 and the passive components 730.

Figure 8:
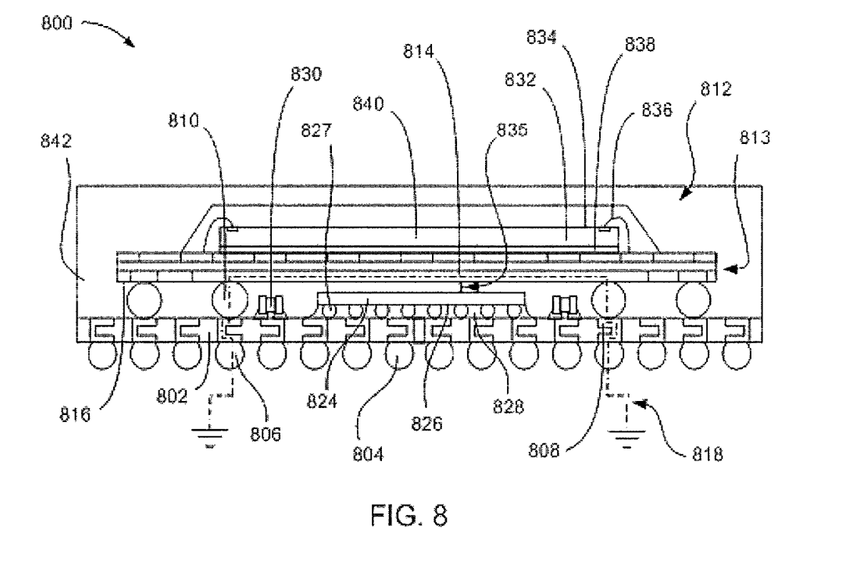
FIG. 8 is a cross-sectional view of an integrated circuit packaging system in a further embodiment of the present invention.

Referring now to FIG. 8, therein is shown a cross-sectional view of an integrated circuit packaging system 800 in a further embodiment of the present invention. The integrated circuit packaging system 800 is shown having a substrate 802 such as a laminated plastic or ceramic substrate.

Below the substrate 802 are first external interconnects such as solder bumps 804. Below the substrate 802 second external interconnects 806 such as solder bumps are also mounted. The second external interconnects 806 are connected to the substrate 802 and to substrate-interconnects 808 within the substrate.

The substrate-interconnects 808 electrically connect the second external interconnects 806 through the substrate 802 to first internal interconnects 810, such as solder balls, mounted above the substrate 802.

Mounted above the first internal interconnects 810 is a structure such as an inner-stacking-module 812 with an inner-stacking-module-substrate 813. The inner-stacking-module-substrate 813 is typically a UV stabilized woven glass and epoxy resin with etched copper conductive pathways.

The inner-stacking-module-substrate 813 has an integral-interposer-structure such as an integral-conductive-shield 814 such as a copper sheet attached to a bottom surface 816 of the inner-stacking-module-substrate 813. The integral-conductive-shield 814 is attached to the first internal interconnects 810. This provides a grounding path 818 from the integral-conductive-shield 814 through the first internal interconnects 810, the substrate-interconnects 808, and the second external interconnects 806. The grounding path 818 may be connected to ground when incorporated into a larger electronic system.

Mounted above the substrate 802 and between the first internal interconnects 810 is an integrated circuit 824 such as a flip-chip with an active side 826. The active side 826 of the integrated circuit 824 faces toward the substrate 802 and is connected to the substrate with second internal interconnects such as solder balls 827.

An underfill 828 fills between the integrated circuit 824 and the substrate 802. The underfill 828 provides extra rigidity and thermal conductivity. Further, mounted above the substrate 802 and between the first internal interconnects 810 are passive components 830 such as resistors, capacitors, or inductors.

The first internal interconnects 810 provides a stand-off-height 835 between the integral-conductive-shield 814 and the integrated circuit 824 by supporting the integral-conductive-shield 814 above the integrated circuit 824. The inner-stacking-module-substrate 813 is further connected to the substrate 802 with the solder balls 827.

Mounted above the inner-stacking-module-substrate 813 is an inner-stacking-module-die 832 such as a wire-bonded die with an active side 834. The active side 834 of the inner-stacking-module-die 832 is connected to the inner-stacking-module-substrate 813 with inner-stacking-module-bond wires 836.

The inner-stacking-module-die 832 is attached to the inner-stacking-module-substrate 813 with an inner-stacking-module-die-attach-adhesive 838. Encapsulating the inner-stacking-module-die 832 is an inner-stacking-module-encapsulation 840. Encapsulating the integrated circuit 824, the passive components 830, and the inner-stacking-module 812 is an encapsulation 842.

Figure 9:
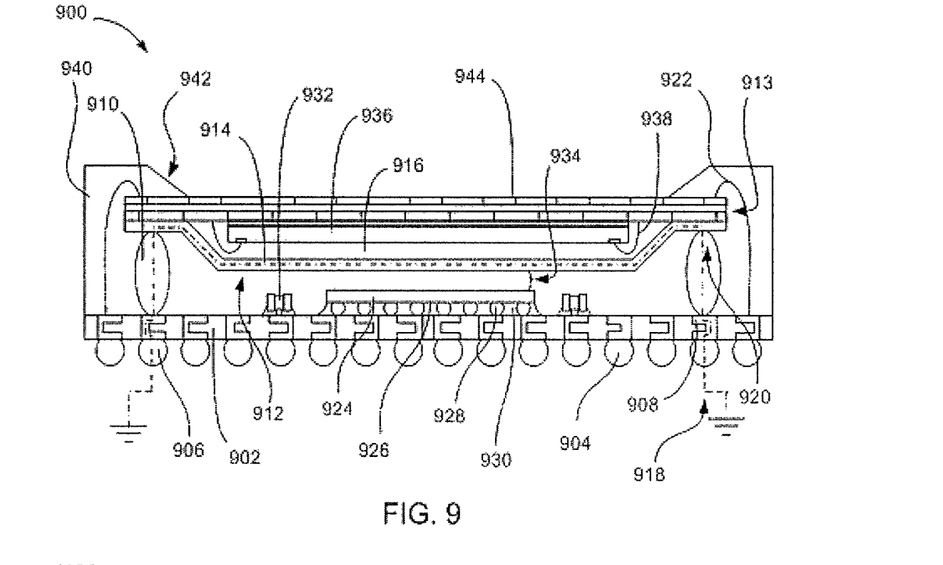
FIG. 9 is a cross-sectional view of an integrated circuit packaging system in a further embodiment of the present invention.

Referring now to FIG. 9, therein is shown a cross-sectional view of an integrated circuit packaging system 900 in a further embodiment of the present invention. The integrated circuit packaging system 900 is shown having a substrate 902 such as a laminated plastic or ceramic substrate.

Below the substrate 902 are first external interconnects such as solder bumps 904. Below the substrate 902 second external interconnects 906 such as solder bumps are also mounted. The second external interconnects 906 are connected to the substrate 902 and to substrate-interconnects 908 within the substrate.

The substrate-interconnects 908 electrically connect the second external interconnects 906 through the substrate 902 to first internal interconnects 910, such as solder pillars, mounted above the substrate 902.

Mounted above the first internal interconnects 910 is a structure such as an inner-stacking-module 912 with an inner-stacking-module-substrate 913. The inner-stacking-module-substrate 913 is typically a UV stabilized woven glass and epoxy resin with etched copper conductive pathways and acts as an interfacing structure when other electronic components are mounted externally.

The inner-stacking-module 912 has an integral-interposer-structure such as an integral-conductive-shield 914 such as a copper sheet coated on an inner-stacking-module-encapsulation 916 and the inner-stacking-module-substrate 913 of the inner-stacking-module 912. The integral-conductive-shield 914 is attached to the first internal interconnects 910. This provides a grounding path 918 from the integral-conductive-shield 914 through the first internal interconnects 910, the substrate-interconnects 908, and the second external interconnects 906.

The grounding path 918 may be connected to ground when incorporated into a larger electronic system.

The integral-conductive-shield 914 coated on the inner-stacking-module-encapsulation 916 also decreases the yield loss risk by using inner-stacking-modules that are already verified as known good inner-stacking-modules.

Mounted above the substrate 902 and between the first internal interconnects 910 is an integrated circuit 924 such as a flip-chip with an active side 926. The active side 926 of the integrated circuit 924 faces toward the substrate 902 and is connected to the substrate with third internal interconnects such as solder balls 928.

An underfill 930 fills between the integrated circuit 924 and the substrate 902. The underfill 930 provides extra rigidity and thermal conductivity. Further, mounted above the substrate 902 and between the first internal interconnects 910 are passive components 932 such as resistors, capacitors, or inductors.

The first internal interconnects 910 provides a stand-off-height 934 between the integral-conductive-shield 914 and the integrated circuit 924 by supporting the integral-conductive-shield 914 above the integrated circuit 924.

The inner-stacking-module-encapsulation 916 encapsulates an inner-stacking-module-die 936 such as a wire-bonded die. The inner-stacking-module-die 936 is connected to the inner-stacking-module-substrate 913 with inner-stacking-module-interconnects 938 such as bond wires.

Encapsulating the integrated circuit 924 and the passive components 932 is an encapsulation 940. The encapsulation 940 has encapsulation risers 942 which rise up from the inner-stacking-module-substrate 913 and encapsulate the bond wires 922 connecting the inner-stacking-module-substrate 913 to the substrate 902. Between the encapsulation risers 942 an exposed portion 944 of the inner-stacking-module-substrate 913 may be connected to external electronic components, not shown.

Figure 10:
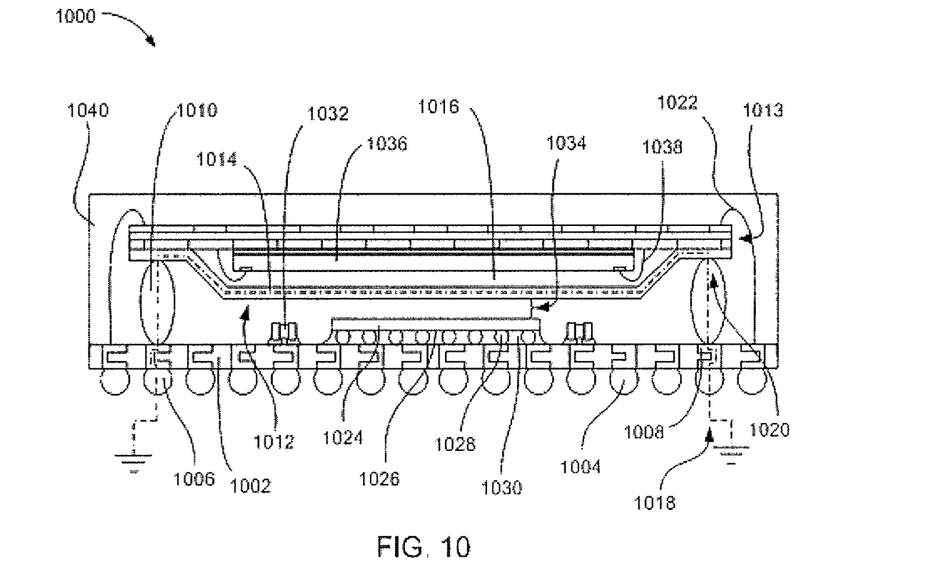
FIG. 10 is a cross-sectional view of an integrated circuit packaging system in a further embodiment of the present invention.

Referring now to FIG. 10, therein is shown a cross-sectional view of an integrated circuit packaging system 1000 in a further embodiment of the present invention. The integrated circuit packaging system 1000 is shown having a substrate 1002 such as a laminated plastic or ceramic substrate.

Below the substrate 1002 are first external interconnects such as solder bumps 1004. Below the substrate 1002 second external interconnects 1006 such as solder bumps are also mounted. The second external interconnects 1006 are connected to the substrate 1002 and to substrate-interconnects 1008 within the substrate.

The substrate-interconnects 1008 electrically connect the second external interconnects 1006 through the substrate 1002 to first internal interconnects 1010, such as solder pillars, mounted above the substrate 1002.

Mounted above the first internal interconnects 1010 is a structure such as an inner-stacking-module 1012 with an inner-stacking-module-substrate 1013. The inner-stacking-module-substrate 1013 is typically a UV stabilized woven glass and epoxy resin with etched copper conductive pathways and acts as an interfacing structure when other electronic components are mounted externally.

The inner-stacking-module 1012 has an integral-interposer-structure such as an integral-conductive-shield 1014 such as a copper sheet coated on an inner-stacking-module-encapsulation 1016 and the inner-stacking-module-substrate 1013 of the inner-stacking-module 1012. The integral-conductive-shield 1014 is attached to the first internal interconnects 1010. This provides a grounding path 1018 from the integral-conductive-shield 1014 through the first internal interconnects 1010, the substrate-interconnects 1008, and the second external interconnects 1006.

The grounding path 1018 may be connected to ground when incorporated into a larger electronic system.

The integral-conductive-shield 1014 coated on the inner-stacking-module-encapsulation 1016 also decreases the yield loss risk by using inner-stacking-modules that are already verified as known good inner-stacking-modules.

Mounted above the substrate 1002 and between the first internal interconnects 1010 is an integrated circuit 1024 such as a flip-chip with an active side 1026. The active side 1026 of the integrated circuit 1024 faces toward the substrate 1002 and is connected to the substrate with third internal interconnects such as solder balls 1028.

An underfill 1030 fills between the integrated circuit 1024 and the substrate 1002. The underfill 1030 provides extra rigidity and thermal conductivity. Further, mounted above the substrate 1002 and between the first internal interconnects 1010 are passive components 1032 such as resistors, capacitors, or inductors.

The first internal interconnects 1010 provides a stand-off-height 1034 between the integral-conductive-shield 1014 and the integrated circuit 1024 by supporting the integral-conductive-shield 1014 above the integrated circuit 1024.

The inner-stacking-module-encapsulation 1016 encapsulates an inner-stacking-module-die 1036 such as a wire-bonded die. The inner-stacking-module-die 1036 is connected to the inner-stacking-module-substrate 1013 with inner-stacking-module-interconnects 1038 such as bond wires.

Encapsulating the integrated circuit 1024 and the passive components 1032 is an encapsulation 1040. The encapsulation 1040 may fully encapsulate the inner-stacking-module 1012.

Figure 11:
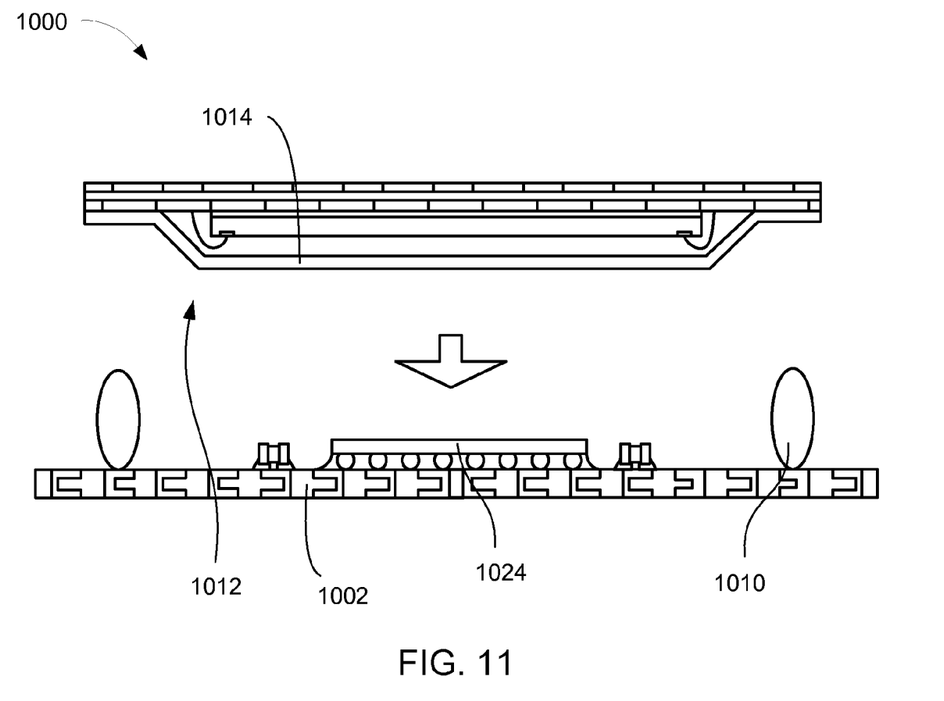
FIG. 11 is the integrated circuit packaging system of FIG. 10 in a mounting phase of manufacture.

Referring now to FIG. 11, therein is shown the integrated circuit packaging system 1000 of FIG. 10 in a mounting phase of manufacture. The integrated circuit packaging system 1000 is shown having the inner-stacking-module 1012 mounted over the integrated circuit 1024, the first internal interconnects 1010, and the substrate 1002.

The integral-conductive-shield 1014 is integral to the inner-stacking-module 1012 because it is fabricated with the inner-stacking-module 1012 before it is mounted above the substrate 1002.

Figure 12:
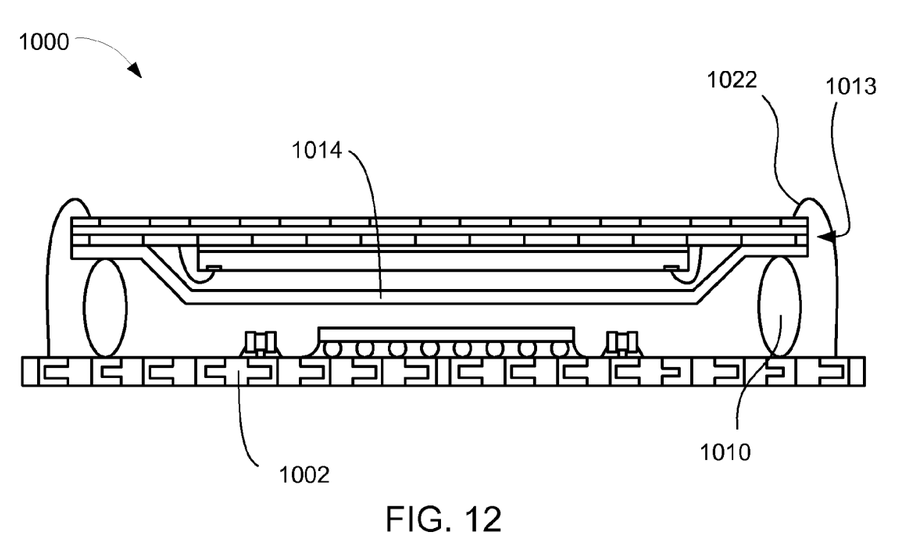
FIG. 12 is the integrated circuit packaging system of FIG. 10 after a wire-bonding phase of manufacture.

Referring now to FIG. 12, therein is shown the integrated circuit packaging system 1000 of FIG. 10 after a wire-bonding phase of manufacture. The integrated circuit packaging system 1000 is shown having the integral-conductive-shield 1014 connected to the first internal interconnects 1010 and the bond wires 1022 connecting the inner-stacking-module-substrate 1013 to the substrate 1002.

Figure 13A:
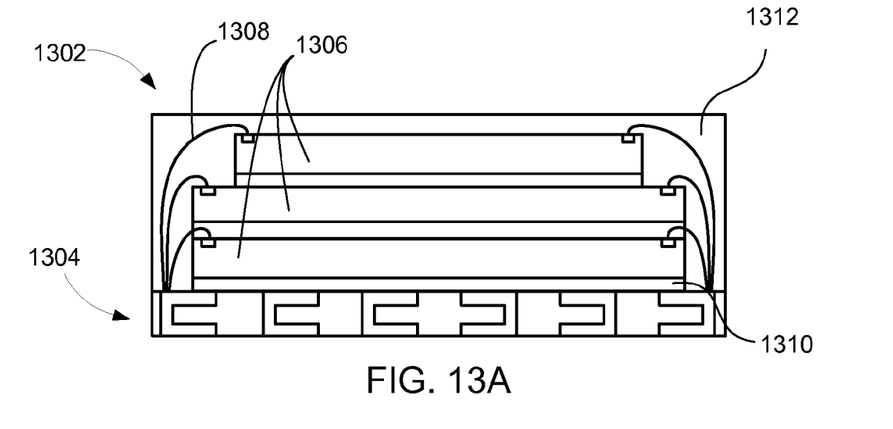
FIGS. 13A-E are cross-sectional views of external electric components for an embodiment of the present invention.

Referring now to FIG. 13A, therein is shown a cross-sectional view of an external electric component such as an array package 1302 having a substrate 1304 with multiple-integrated-circuit-dies 1306 stacked above the substrate 1304. The multiple-integrated-circuit-dies 1306 are connected to the substrate 1304 with interconnects such as bond wires 1308. The multiple-integrated-circuit-dies 1306 are attached with a die attach adhesive 1310. An encapsulation 1312 such as a film assisted molding encapsulates the multiple-integrated-circuit-dies 1306 and the bond wires 1308.

Figure 13B:
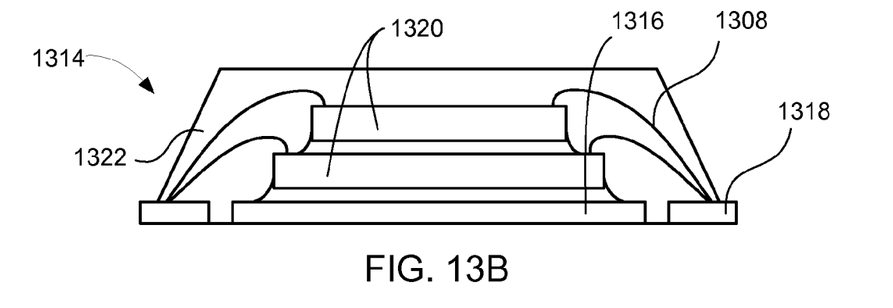

Referring now to FIG. 13B, therein is shown a cross-sectional view of an external electric component such as a quad-flatpak package 1314 having a die pad 1316 and bond-fingers 1318. Stacked above the die pad 1316 are multiple-integrated-circuit-dies 1320 attached with the die attach adhesive 1310. The multiple-integrated-circuit-dies 1320 are connected to the bond fingers 1318 with the bond wires 1308. The multiple-integrated-circuit-dies 1320 and the bond wires 1308 are encapsulated in an encapsulation 1322 such as a film assisted molding.

Figure 13C:
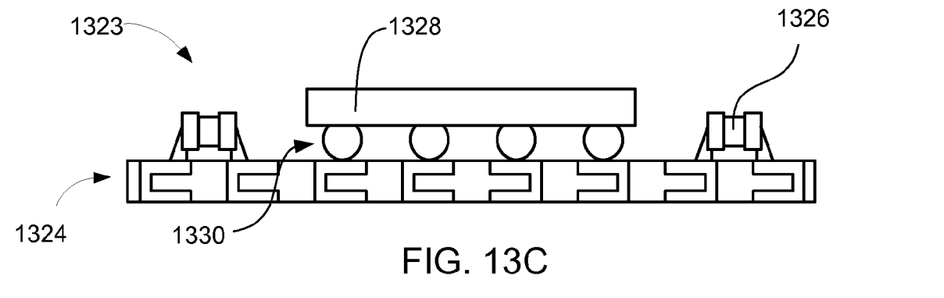

Referring now to FIG. 13C, therein is shown a cross-sectional view of an external electric component such as a compound circuit 1323 having a substrate 1324. Above the substrate 1324 passive components 1326 such as resistors, capacitors, and inductors are mounted peripheral to an integrated circuit 1328 such as a flip chip. The integrated circuit 1328 is connected to the substrate 1324 with interconnects such as solder bumps 1330.

Figure 13D:
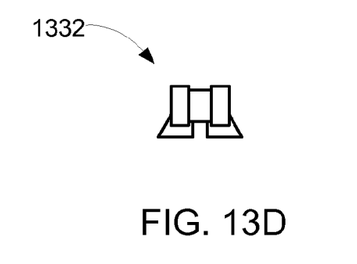

Referring now to FIG. 13D, therein is shown a cross-sectional view of an external electric component such as a passive component 1332 such as a resistor, capacitor, or inductor.

Figure 13E:
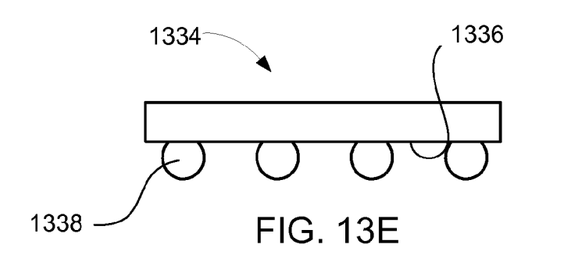

Referring now to FIG. 13E, therein is shown a cross-sectional view of an external electric component such as an integrated circuit die 1334 such as a flip chip. The integrated circuit die 1334 is shown having an active side 1336 with interconnects 1338 such as solder bumps mounted below.

Figure 14A:
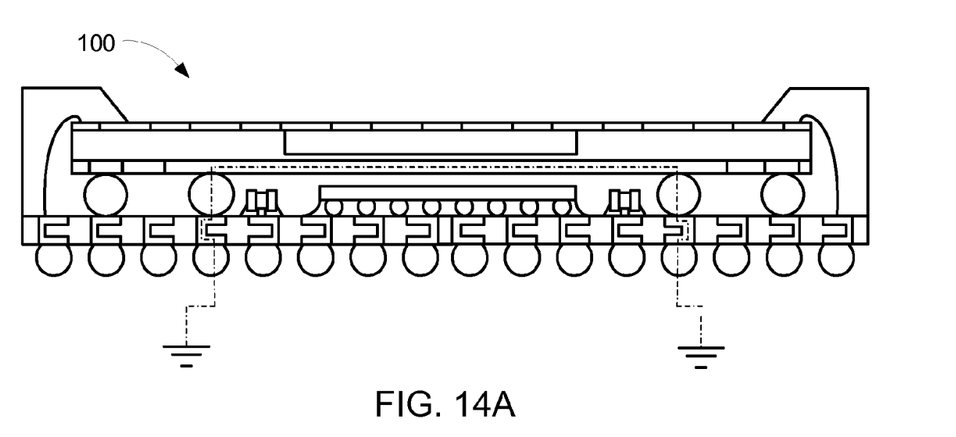
FIG. 14A is the integrated circuit packaging system of FIG. 1.

Referring now to FIG. 14A, therein is shown the integrated circuit packaging system 100 of FIG. 1 in the same embodiment and in the same configuration as described supra.

Figure 14B:
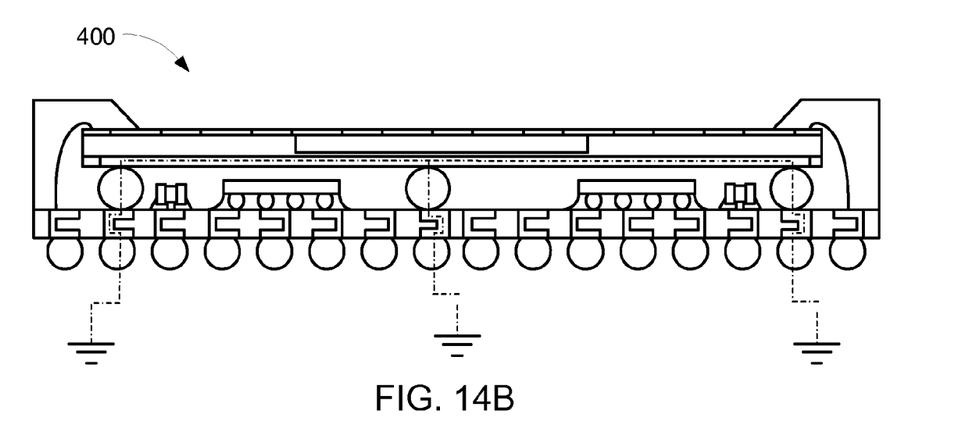
FIG. 14B is the integrated circuit packaging system of FIG. 4.

Referring now to FIG. 14B, therein is shown the integrated circuit packaging system 400 of FIG. 4 in the same embodiment and in the same configuration as described supra.

Figure 14C:
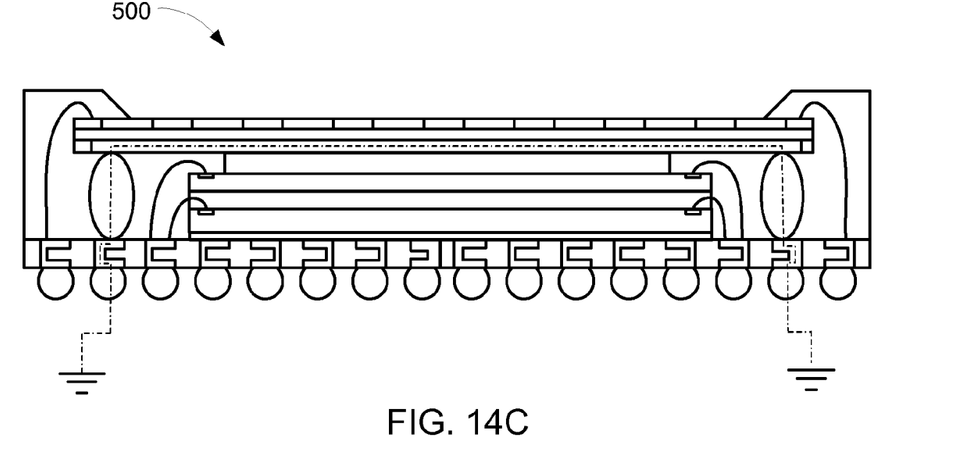
FIG. 14C is the integrated circuit packaging system of FIG. 5.

Referring now to FIG. 14C, therein is shown the integrated circuit packaging system 500 of FIG. 5 in the same embodiment and in the same configuration as described supra.

Figure 14D:
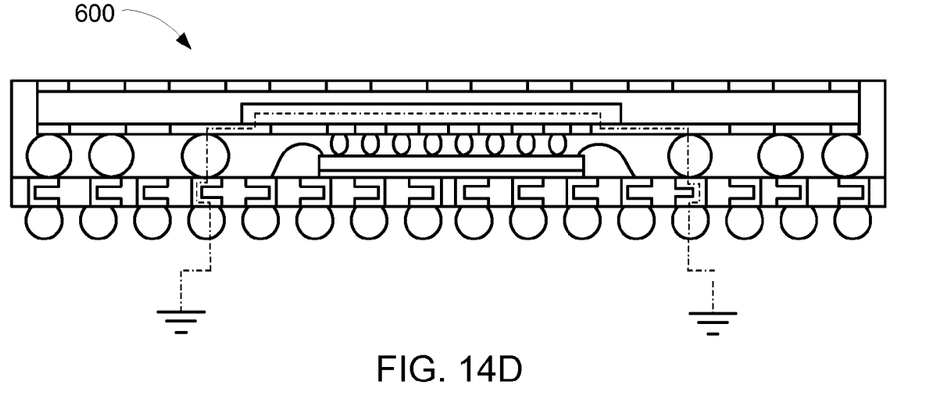
FIG. 14D is the integrated circuit packaging system of FIG. 6.

Referring now to FIG. 14D, therein is shown the integrated circuit packaging system 600 of FIG. 6 in the same embodiment and in the same configuration as described supra.

Figure 14E:
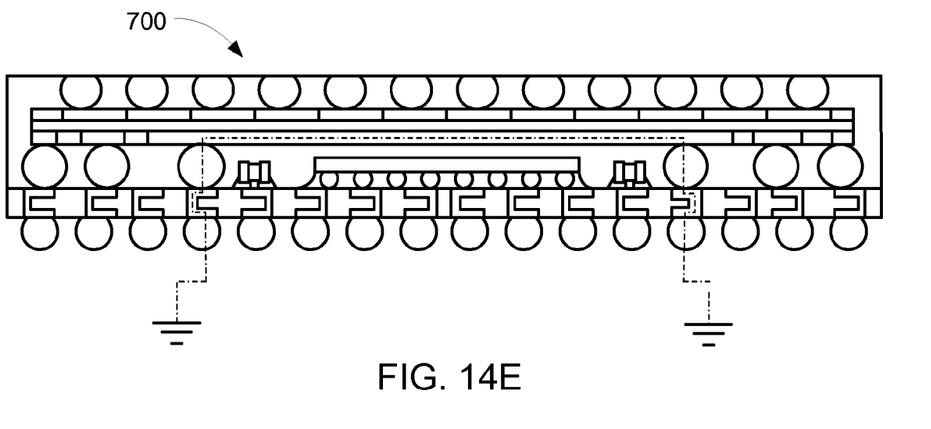
FIG. 14E is the integrated circuit packaging system of FIG. 7.

Referring now to FIG. 14E, therein is shown the integrated circuit packaging system 700 of FIG. 7 in the same embodiment and in the same configuration as described supra.

Figure 14F:
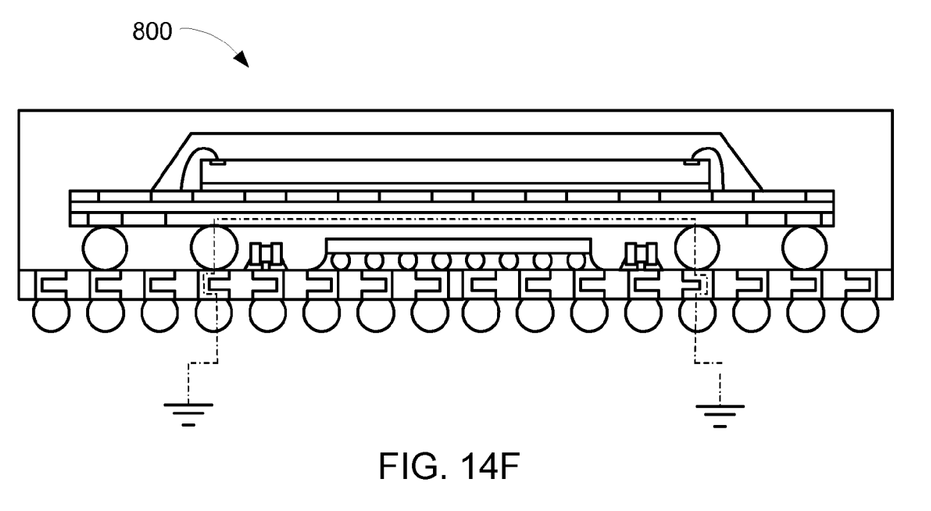
FIG. 14F is the integrated circuit packaging system of FIG. 8.

Referring now to FIG. 14F, therein is shown the integrated circuit packaging system 800 of FIG. 8 in the same embodiment and in the same configuration as described supra.

Figure 14G:
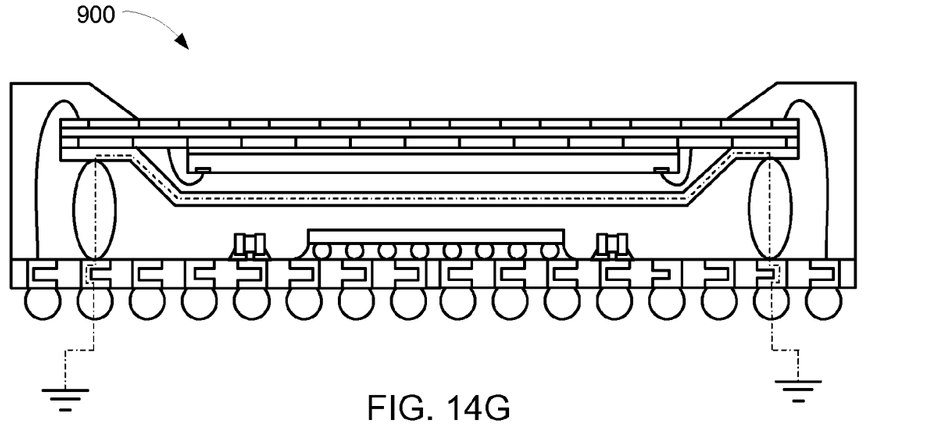
FIG. 14G is the integrated circuit packaging system of FIG. 9.

Referring now to FIG. 14G, therein is shown the integrated circuit packaging system 900 of FIG. 9 in the same embodiment and in the same configuration as described supra.

Figure 14H:
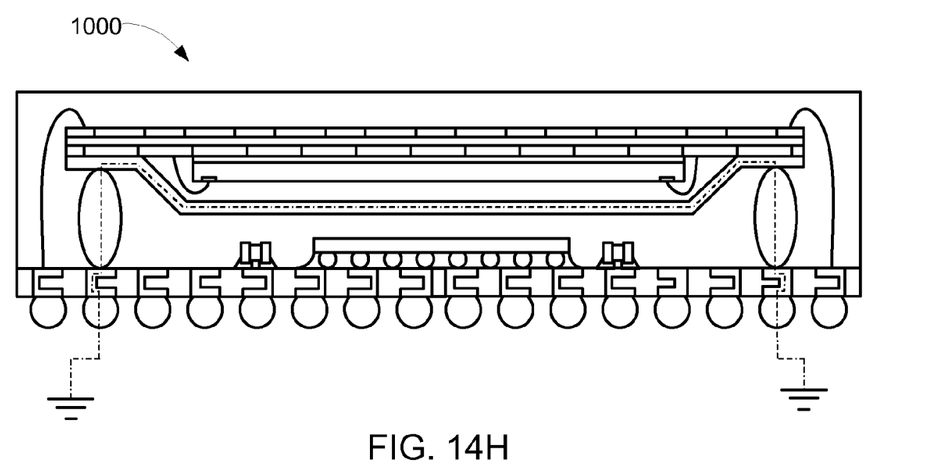
FIG. 14H is the integrated circuit packaging system of FIG. 10.

Referring now to FIG. 14H, therein is shown the integrated circuit packaging system 1000 of FIG. 10 in the same embodiment and in the same configuration as described supra.

Figure 15A:
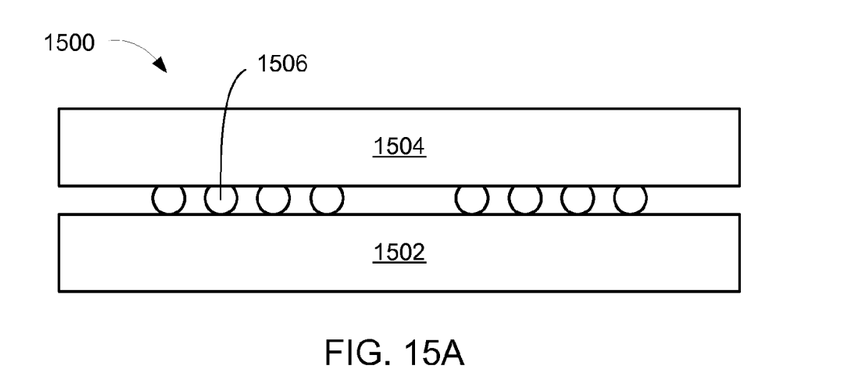
FIG. 15A is a diagram of a further embodiment of the present invention.

Referring now to FIG. 15A, therein is shown a diagram 1500 of a further embodiment of the present invention. The diagram 1500 is shown having any one of the integrated circuit packaging systems from FIGS. 14A-H in a block 1502 with any one of the external electric components from FIGS. 13A-E in a block 1504 and mounted above the block 1502. The block 1504 is shown connected to the block 1502 with interconnects such as solder bumps 1506.

Figure 15B:
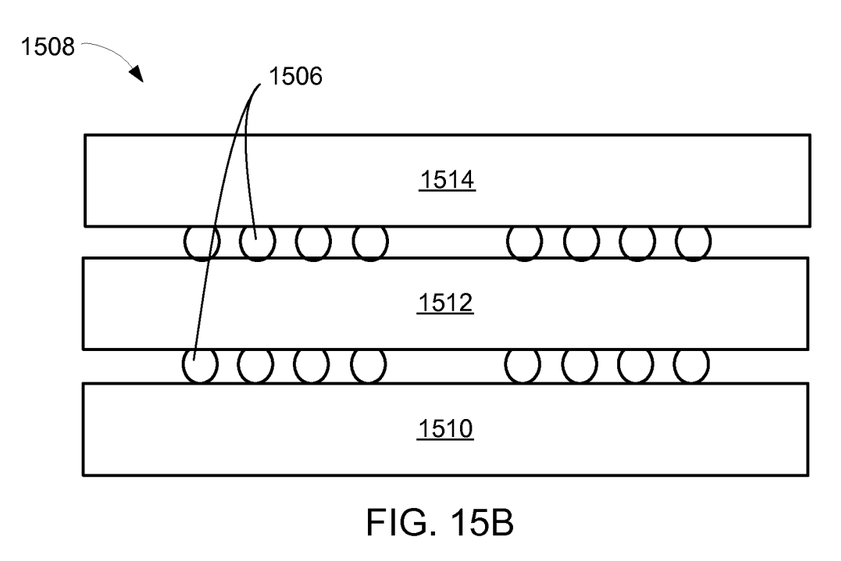
FIG. 15B is a diagram of a further embodiment of the present invention.

Referring now to FIG. 15B, therein is shown a diagram 1508 of a further embodiment of the present invention. The diagram 1508 is shown having any one of the external electric components from FIGS. 13A-E in a block 1510 with any one of the integrated circuit packaging systems from FIGS. 14A-H in a block 1512 and mounted above the block 1510. Mounted above the block 1512 is any one of the external electric components from FIGS. 13A-E in a block 1514. The block 1514 is connected to the block 1512 with the solder bumps 1506. The block 1512 is connected to the block 1510 with the solder bumps 1506.

Figure 16:
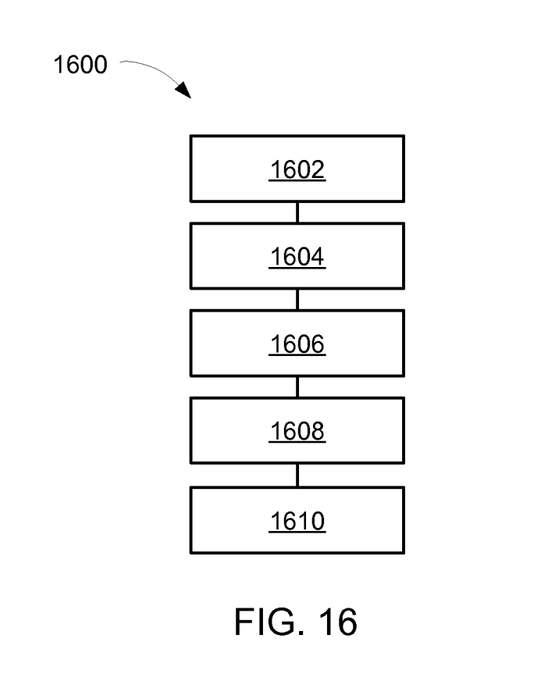
FIG. 16 is a flow chart of a method of manufacture of an integrated circuit packaging system in a further embodiment of the present invention.

Referring now to FIG. 16, therein is shown a flow chart of a method 1600 of manufacture of an integrated circuit packaging system 100 of FIG. 1 in a further embodiment of the present invention. The method 1600 includes providing a substrate having a substrate-interconnect in a block 1602; mounting an integrated circuit above and to the substrate in a block 1604; mounting an internal interconnect to the substrate-interconnect in a block 1606; mounting a structure having an integral-interposer-structure over the substrate and over the integrated circuit with the integral-interposer-structure connected to the internal interconnect in a block 1608; and encapsulating the internal interconnect and the integrated circuit with an encapsulation in a block 1610.

It has been discovered that the present invention thus has numerous aspects.

A principle aspect that has been discovered is that the present invention substantially reduces costs. First, the process does not require additional shield forming or mounting processes, which decreases the amount of labor required to produce each unit.

Second, the integral-conductive-shield does not require additional material to create an electromagnetic shield because the integral-conductive-shield may be constructed in the interposer using copper layers already used in the formation of the interposer. This may be achieved by leaving intact a metal layer forming the integral-conductive-shield instead of selectively etching contact pads.

Another aspect is that the integral-conductive-shield of the present invention provides a very large grounding plane at an intermediate level. This enhances electrical performance of externally mounted components.

Other aspects include: reduced path to ground; additional support under overhangs of the interposer during the wire-bonding phase of manufacture; and decreases the yield loss risk by using inner-stacking-modules that are already verified as known good inner-stacking-modules.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integral-conductive-shield system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate having a plurality of substrate-interconnects;
   mounting a plurality of internal interconnects to and over the plurality of substrate-interconnects;
   mounting an integrated circuit above the substrate and the plurality of substrate-interconnects, the integrated circuit adjacent to and between the plurality of internal interconnects;
   mounting an interposer having an integral-interposer-structure over the substrate, the plurality of substrate-interconnects, the integrated circuit and the plurality of internal interconnects, the integral-interposer-structure extending past peripheral sides of the integrated circuit and electrically connected to the plurality of internal interconnects, wherein mounting the interposer includes mounting an integral-conductive-shield having a hole;
   embedding a die in the integral-interposer-structure between a top surface and a bottom surface of the integral-interposer-structure; and
   forming an encapsulation encapsulating the plurality of internal interconnects and the integrated circuit.

2. The method as claimed in claim 1 wherein mounting the plurality of internal interconnects includes mounting each of the plurality of internal interconnects having a stand-off-height from the integrated circuit to the integral-conductive-shield.

3. The method as claimed in claim 1 wherein mounting the interposer further includes forming a grounding path from the integral-conductive shield through the plurality of internal interconnects, with the grounding path extending over and across the integrated circuit.

4. The method as claimed in claim 1 further comprising:
   mounting an external interconnect to and under each of the plurality of substrate-interconnects.

5. The method as claimed in claim 1 wherein mounting the integrated circuit includes mounting a flip-chip.

6. The method as claimed in claim 1 further comprising
   mounting a passive component between the substrate and the integral-interposer-structure.

7. An integrated circuit packaging system comprising:
   a substrate having a plurality of substrate-interconnects;
   a plurality of internal interconnects mounted to and over the plurality of substrate-interconnects;
   an integrated circuit mounted above the substrate and the plurality of substrate-interconnects, the integrated circuit adjacent to and between the plurality of internal interconnects;
   an interposer having an integral-interposer-structure mounted over the substrate, the plurality of substrate-interconnects, the integrated circuit and the plurality of internal interconnects, the integral-interposer-structure extending past peripheral sides of the integrated circuit and electrically connected to the plurality of internal interconnects, the integral-interposer-structure having a die embedded in the integral-interposer-structure between a top surface and a bottom surface of the integral-interposer-structure, wherein the integral-interposer-structure is an integral-conductive-shield having a hole; and
   an encapsulation encapsulating the plurality of internal interconnects and the integrated circuit.

8. The system as claimed in claim 7 wherein each of the plurality of internal interconnects includes a stand-off-height from the integrated circuit to the integral-conductive-shield.

9. The system as claimed in claim 7 further comprising a ground path from the integral-conductive shield through the plurality of internal interconnects with the ground path extending over and across the integrated circuit.

10. The system as claimed in claim 7 further comprising:
    an external interconnect mounted to each of the plurality of substrate-interconnects.

11. The system as claimed in claim 7 wherein the integrated circuit is a flip-chip.

12. The system as claimed in claim 7 further comprising a passive component mounted above the substrate and under the integral-interposer-structure.

* * * * *